United States Patent [19]

Matsumoto et al.

[11] Patent Number: 4,972,225
[45] Date of Patent: Nov. 20, 1990

[54] SHEET HEATING DEVICE

[75] Inventors: Yumio Matsumoto, Kasugai; Yasuo Kimura, Ichinomiya; Osamu Takagi, Nagoya, all of Japan

[73] Assignee: Brother Kogyo Kabushiki Kaisha, Aichi, Japan

[21] Appl. No.: 452,387

[22] Filed: Dec. 19, 1989

[30] Foreign Application Priority Data

Dec. 19, 1988 [JP] Japan .................. 63-164807[U]
Jan. 27, 1989 [JP] Japan .................... 1-8873[U]
Jan. 31, 1989 [JP] Japan ................... 1-11340[U]

[51] Int. Cl.$^5$ ............... G03B 27/32; G03B 27/52; G03G 15/20
[52] U.S. Cl. ............................. 355/27; 355/291
[58] Field of Search ..................... 355/27, 285, 291

[56] References Cited

U.S. PATENT DOCUMENTS

| 3,219,799 | 11/1965 | Trumbull et al. | 355/291 X |
|---|---|---|---|
| 3,330,189 | 7/1967 | Vil | 355/291 |
| 3,502,407 | 3/1970 | Granzow et al. | 355/285 |
| 3,873,196 | 3/1975 | Ogawa | 355/291 X |

FOREIGN PATENT DOCUMENTS

| 75680 | 6/1981 | Japan . |
|---|---|---|
| 171977 | 9/1984 | Japan . |
| 63873 | 4/1986 | Japan . |
| 1-85681 | 7/1989 | Japan . |
| 1-85682 | 7/1989 | Japan . |

*Primary Examiner*—Richard A. Wintercorn
*Attorney, Agent, or Firm*—Oliff & Berridge

[57] ABSTRACT

In a sheet heating device for heat-fixing an image on a sheet comprising a sheet guide plate for guiding a sheet therethrough, a pair of sheet feed rollers provided at the upstream of the sheet guide plate for supplying the sheet to the sheet guide plate, a pair of sheet discharge rollers provided at the downstream of the sheet guide plate for discharging the sheet to an outside, and a cover case including a heater for heating air and heating the sheet with the heated air and a blower fan for circulating the heated air through the inner portion of the cover case and the sheet guide plate, plural capillary projections having a lower thermal conductivity than the sheet guide plate are provided at least on the front surface of the sheet guide plate to thereby prevent the sheet from directly contacting the sheet guide plate, or an arcuate member is provided in the cover case to homogeneously guide the heated air over the sheet guide plate to thereby homogeneously heat-fix an image on the sheet.

17 Claims, 9 Drawing Sheets

SHEET HEATING DEVICE

BACKGROUND OF THE INVENTION

The present invention relates to a sheet heating device in which a sheet having an image thereon is delivered while being heated by a heater disposed in a sheet feed path, and more particularly to a sheet heating device suitable for an image forming apparatus such as a copying machine.

In a conventional sheet heating device used in an image forming apparatus such as a copying machine, in which an image of thermally fusible substances formed on a piece of sheet such as paper is heat-fixed, the sheet is clamped between sheet feed rollers to supply the sheet to a sheet guide path and fed through sheet discharge rollers for discharging the sheet to a discharge cassette. During a heat-fixing process of the conventional sheet heating device, air heated by a heater which is provided in the sheet heating device is circulated and impinged onto the sheet, or radiation heat of the heater is applied to the sheet to heat-fix the image on the sheet while the sheet is fed through the sheet guide path in the sheet heating device. After the heat-fixing process, the sheet is clamped and discharged by the discharge rollers.

FIG. 1 shows a conventional sheet heating device used in an image forming apparatus. This sheet heating device adopts an air heating method in which a heated air is applied to the sheet introduced into the sheet heating device to heat-fix the image on the sheet. In this device, two pairs of rotatable rollers (sheet feeding rollers 32, 33 and sheet discharge rollers 36, 42 are provided at both ends of a sheet guide path (plate) 50, and a cover case 56 is provided such that it covers the sheet guide path 50. The cover case 56 includes a heater 57 and a blower fan 60 for supplying air to the heater 57. The air supplied from the fan 60 is heated by the heater 57 and circulated along the inner wall of the cover case 56 and the sheet guide path 50 by convection (that is, the fan 60 is used to form a convection of heated air) to heat-fix the image on the sheet during a sheet feeding operation in the heat-fixing device.

In the conventional sheet heating device as described above, the sheet guide path 50 comprises an iron guide plate and therefore the temperature of the guide plate 50 is easily increased during the heat-fixing process. If the sheet 17 having the image thereon is introduced into the sheet heating device with the image surface erroneously placed face down, the thermally fusible substances forming the image are fused by contact with the iron guide plate of high temperature and is liable to adhere to the iron guide plate 50. This fusion of the substances causes the iron guide plate 50 to be stained and its friction resistance to be increased. As a result, the feeding of the sheet along the sheet guide plate 50 is prevented nd a sheet jam is liable to occur.

Further, in the conventional sheet heating device, the heated air is circulated in the cover case 56 such that it flows along the inner wall of the cover case 56 and the sheet guide plates 50 as shown in FIG. 1. Accordingly, the temperature of the heated air is higher beside the sheet discharge rollers 36, 42 than beside the sheet feeding rollers 32, 33, so that the sheet is not effectively heated beside the sheet feeding rollers 32, 33 and the heat-fixing of the sheet is inhomogeneously made.

Still further, in the conventional sheet heating device as described above, during the heat-fixing process of the sheet, the heated air would be leaked from the cover case 56 to heat the sheet feed/discharge rollers (32, 33) and (36, 42). As a result, the sheet would be rapidly heated at the sheet feed and discharge rollers. In this case, the thermally fusible substances forming the image are over-heated, so that they are boiled and bubbles are formed therein to thereby degrade a quality of the image, or the substances are over-heated, so that they are fused at the feed and discharge rollers and would adhere to the 4 rollers to thereby form image damages such as flaw and breakdown and deteriorate the quality of the image.

SUMMARY OF THE INVENTION

In order to overcome the disadvantages of the conventional sheet heating device, an object of the invention is to provide a sheet heating device in which a sheet guide plate is prevented from being directly contacted with a sheet having an image thereon and from being stained by thermally fusible substances forming the image.

Another object of this invention is to provide a sheet heating device in which a heated air is homogeneously circulated in a cover case and a sheet having an image thereon is homogeneously heat-fixed to obtain an image of high quality.

Still another object of this invention is to provide a sheet heating device for preventing the over-heating of sheet feed rollers for clamping and feeding a piece of sheet and sheet discharge rollers for discharging the sheet from the sheet heating device, thereby preventing the generation of bubbles due to the boiling of the thermally fusible substances and the adherence of the substances to the rollers due to the fusion of the substances, and ensuring the high quality of the image.

In order to attain these and other objects, according to one aspect of this invention, there is provided a sheet heating device comprising sheet guide means having a sheet inlet and a sheet outlet at both ends thereof for guiding the sheet therethrough, sheet feeding means provided at the sheet inlet for supplying the sheet through the sheet inlet to the sheet guide means, sheet discharge means for provided at the sheet outlet for discharging the sheet through the sheet outlet, sheet heating means for heating the sheet while the sheet is fed through the sheet guide means, and sheet supporting means comprising plural capillary projections provided on the guide means for supporting thereon the sheet supplied through the sheet inlet to prevent the sheet from directly contacting the sheet guide means, the capillary projections having a lower thermal conductivity than that of the sheet guide means.

Also, according to another aspect of this invention, there is provided a sheet heating device for heat-fixing an image on a sheet comprising sheet guide means having a sheet inlet and a sheet outlet at both ends thereof for guiding the sheet therethrough, sheet feeding means provided at the sheet inlet for supplying the sheet through the sheet inlet to said sheet guide means, sheet discharge means for provided at the sheet outlet for discharging the sheet through the sheet outlet, sheet heating means for heating air and heating the sheet with the heated air while the sheet is fed through the sheet guide means, air convecting means for circulating the heated air by convection while the sheet is heated with the heated air, a cover case having an inner wall provided in such a manner as to cover the sheet guide means, and wherein the cover cases accommodates the sheet heating means and the air convecting means, and convection stabilizing means provided in the cover case for homogeneously guiding the heated air over the sheet guide means to homogeneously heat-fix the image on the sheet.

DESCRIPTION OF THE PREFERRED EMBODIMENTS

Preferred embodiments of the sheet heating device according to this invention will now be described with reference to the accompanying drawings.

Prior to describing the construction and the operation of the sheet heating device, a copying machine in which the sheet heating device of this invention is used will be first described with reference to FIG. 2.

Figure 2:
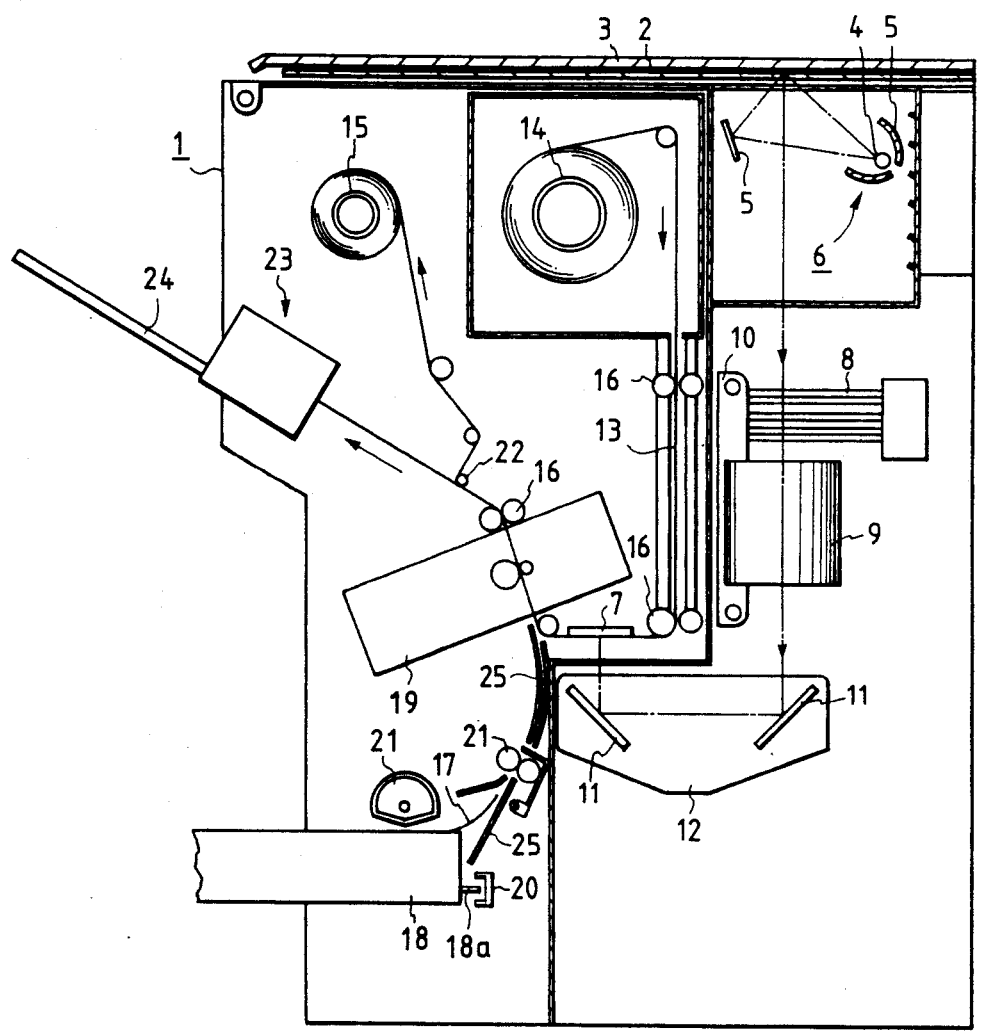
FIG. 2 shows a cross-sectional view of the copying machine in which the sheet heating device according to this invention is provided.

As shown in FIG. 2, on a top portion of a copying machine 1, there are provided an original plate glass 2 on which an original is to be laid, and a cover 3 movable rightwardly and leftwardly for opening/closing the original base glass 2. Under the original base glass 2, there is provided a light source 6 that is composed of a halogen lamp 4 extending in a direction perpendicular to the direction of movement of the original base glass 2 and irradiating light onto the original on the original base glass 2 and a reflector mirror 5 for reflecting the light of the halogen lamp 4 toward the original base glass 2. During the irradiation of the light source 6, the original basic glass 2 is moved rightwardly and leftwardly, whereby the original as a whole is irradiated.

On the other hand, an exposure stand 7 is provided substantially in the middle portion of the copying machine 1. A set of filters 8 for adjusting a color tone of the copied image and a condenser lens 9 are interposed between the light source 6 and the exposure stand 7 and are supported to a mounting plate 10. A pair of reflecting mirrors 11 for adjusting an optical path length and a focus are pivotally supported in a positionally adjustable fashion by a mounting plate 12 between the condenser lens 9 and the exposure stand 7. After the light has been irradiated the original, the light reflected from the original is led to the exposure stand 7 through the filters 8, the condenser lens 9 and the reflecting mirrors 11.

In an inner upper portion of the copying machine 1, a cartridge 14 is detachably encased, and a takeup shaft 15 is rotatably supported. An elongated microcapsule sheet 13 that carries a number of microcapsules encapsulating dye for color copying is encased in the form of a roll in the cartridge 14. After the microcapsule sheet 13 has been drawn from the cartridge 14 by the rotation of a plurality of feed rollers 16, the sheet is wound around the takeup shaft 15, whereupon a part of the sheet traveling along the lower surface of the exposure stand 7 is exposed to thereby form a latent image of the original.

Below the exposure stand 7, a cassette 18 for encasing a number of pieces of developer sheet 17 each having a constant size is detachably mounted in the copying machine 1. A pressure development unit 19 is interposed between the exposure stand 7 and the takeup shaft 15. With such an arrangement, the exposure part of the microcapsule sheet 13 and the developer sheet 17 are brought into pressing contact with each other within the pressure development unit 19, so that a color image is formed on the developer sheet 17 in accordance with the latent image on the microcapsule sheet 13. Also, a projection 18a for detecting size of the developer sheet 17 is provided on the cassette 18. Judging means 20 for judging the size of the developer sheet 17 in accordance with the size of the projection 18a is provided in the copying machine 1.

Between the cassette 18 and the pressure development unit 19, there are provided a plurality of feed rollers 21 for feeding the developer paper 17 toward the pressure development unit 19 and sheet guides 25. On the sheet discharge side of the pressure development unit 19, there is provided a peeling roller 22 for peeling the developer paper 17 away from the microcapsule sheet 13. Downstream of the peeling rollers 22, a sheet heating device 23 is provided for heat-fixing the image formed on the developer sheet 17. The developer sheet 17 discharged from the sheet heating device 23 is received on a discharge tray 24.

In operation for obtaining a color copied image with the copying machine, when a start button (not shown) is depressed, the original base glass 2 is moved to a rightmost movement end, and the left end of the original is located to face the halogen lamp 4 of the light source 6. Thereafter, the halogen lamp 4 is turned on. Under this condition, the original base glass 2 is moved leftward back to the initial position, thereby completing the irradiation of the original by the light.

During the light-irradiation, the microcapsule sheet 13 is moved on the exposure stand 7 at the same speed as that of the original base glass 2. As a result, the latent image of the original is formed on the microcapsule sheet 13 by the reflected light from the original. On the other hand, the developer sheet 17 is moved from the cassette 18 toward the pressure development unit 19 in synchronism with the backward, leftward movement of the original base glass 2. The exposed part of the microcapsule sheet 13 is brought into pressing contact with the developer sheet 17, thereby forming a color image on the developer sheet 17. Thereafter, the developer sheet 17 is led into the sheet heating device 23 by the feed rollers, 16 and the like. The image is heat-fixed by an internal heat of the heating device 23. Then, the developer sheet 17 is discharged to the discharge tray 24.

Hereinafter, the sheet heating device according to this invention will now be described in detail.

Figure 3:
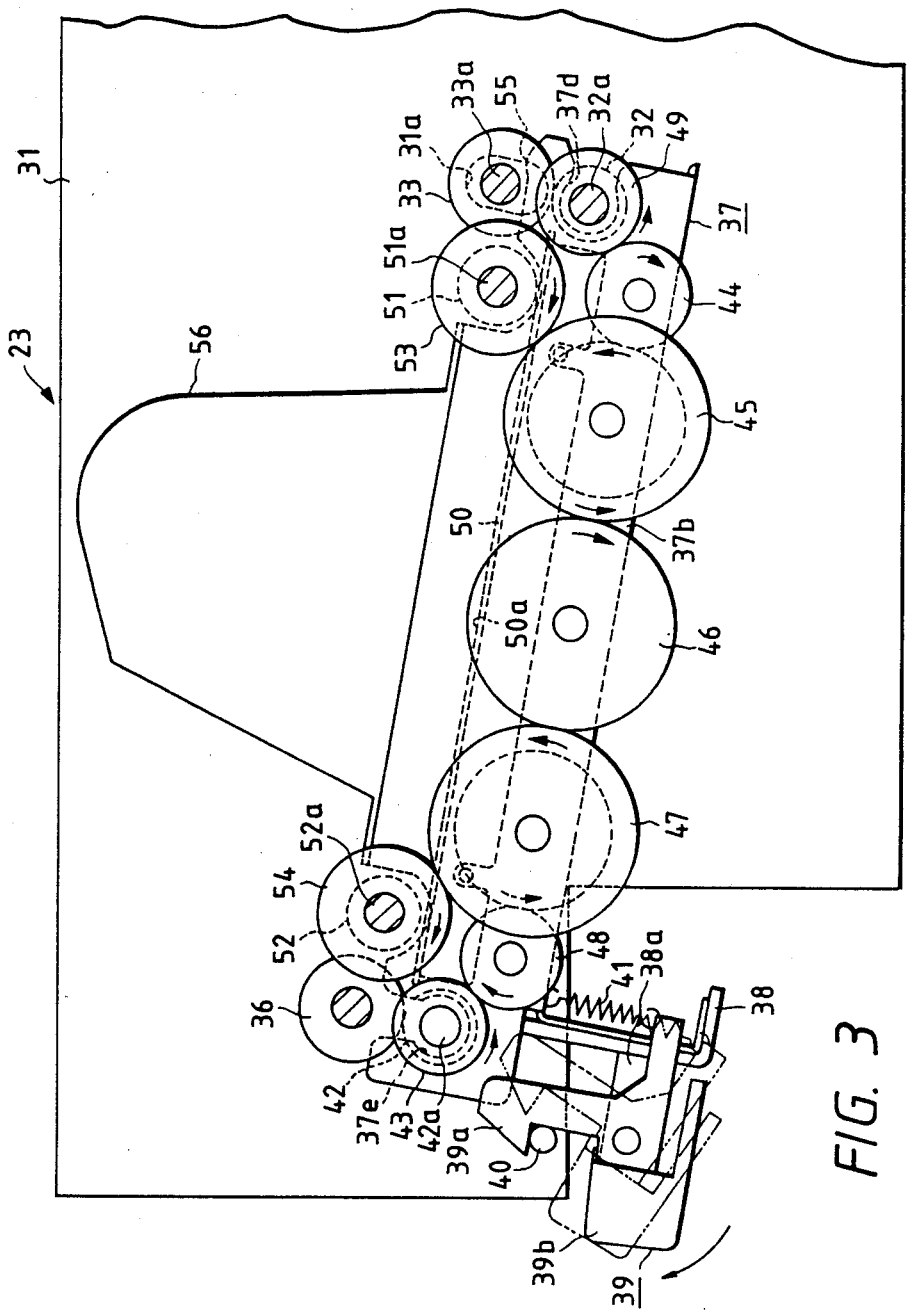
FIG. 3 is a sectional view of an embodiment of the sheet heating device according to this invention.
Figure 4:
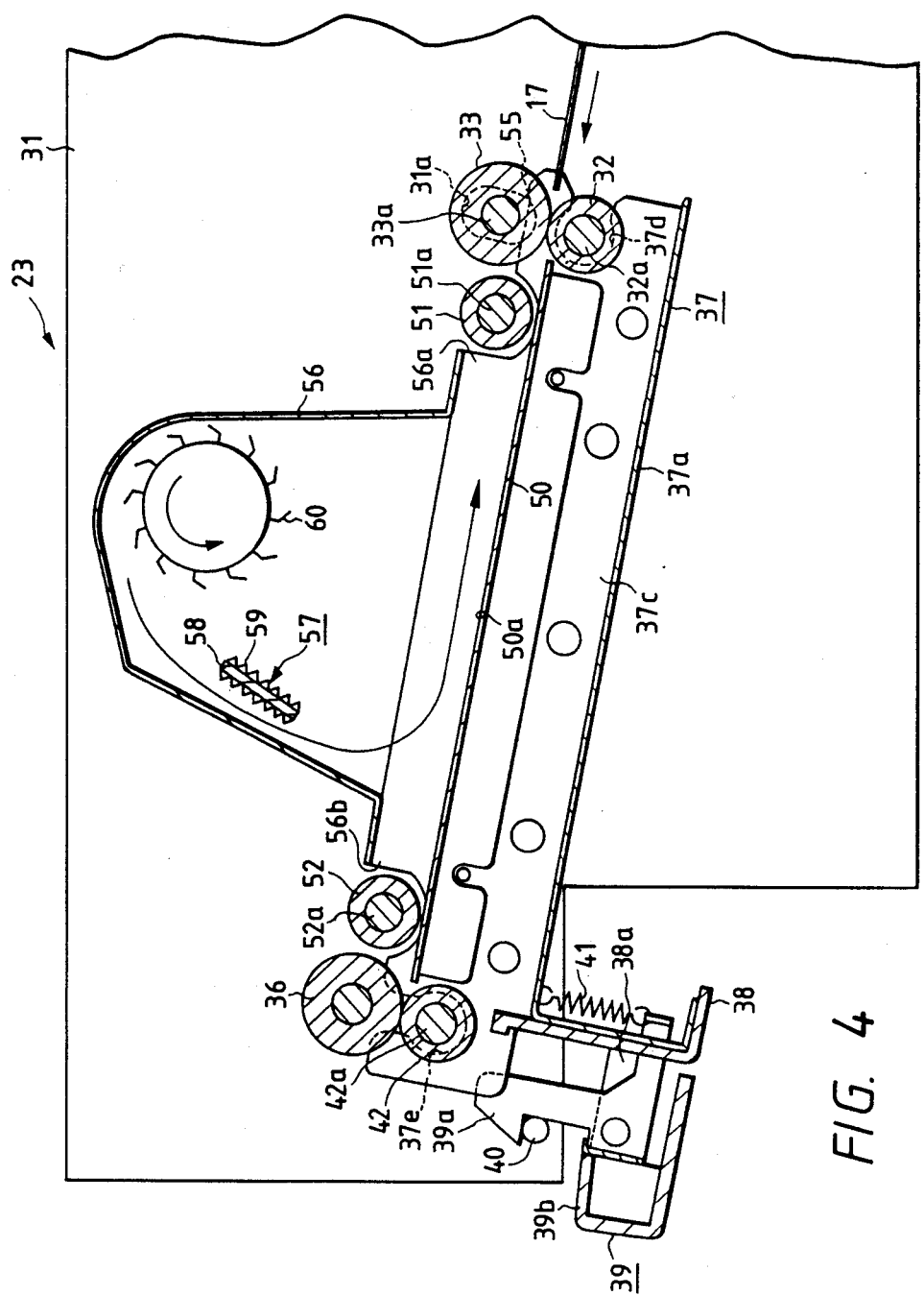
FIG. 4 is a sectional view showing a closed position of a guide plate shown in FIG. 3.
Figure 5:
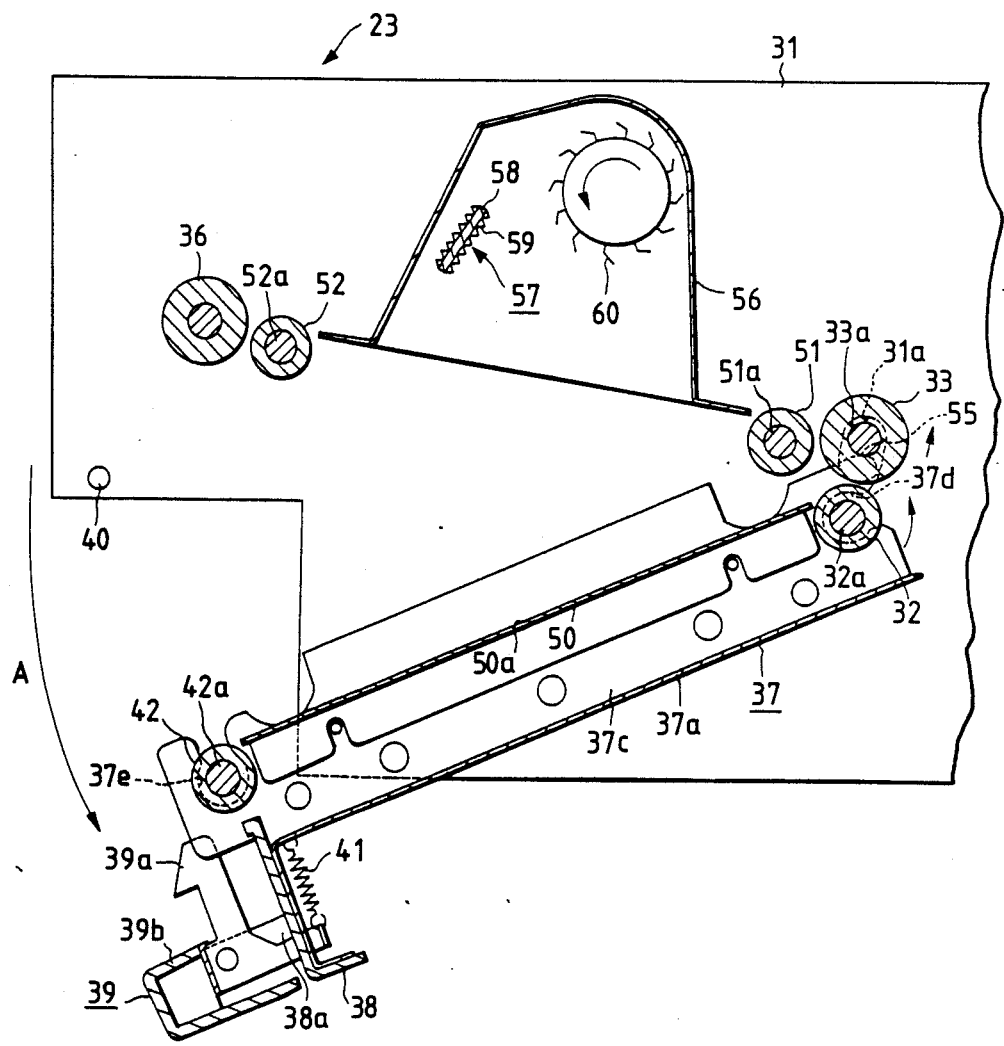
FIG. 5 is a sectional view showing an open position of the guide plate shown in FIG. 3.
Figure 6:
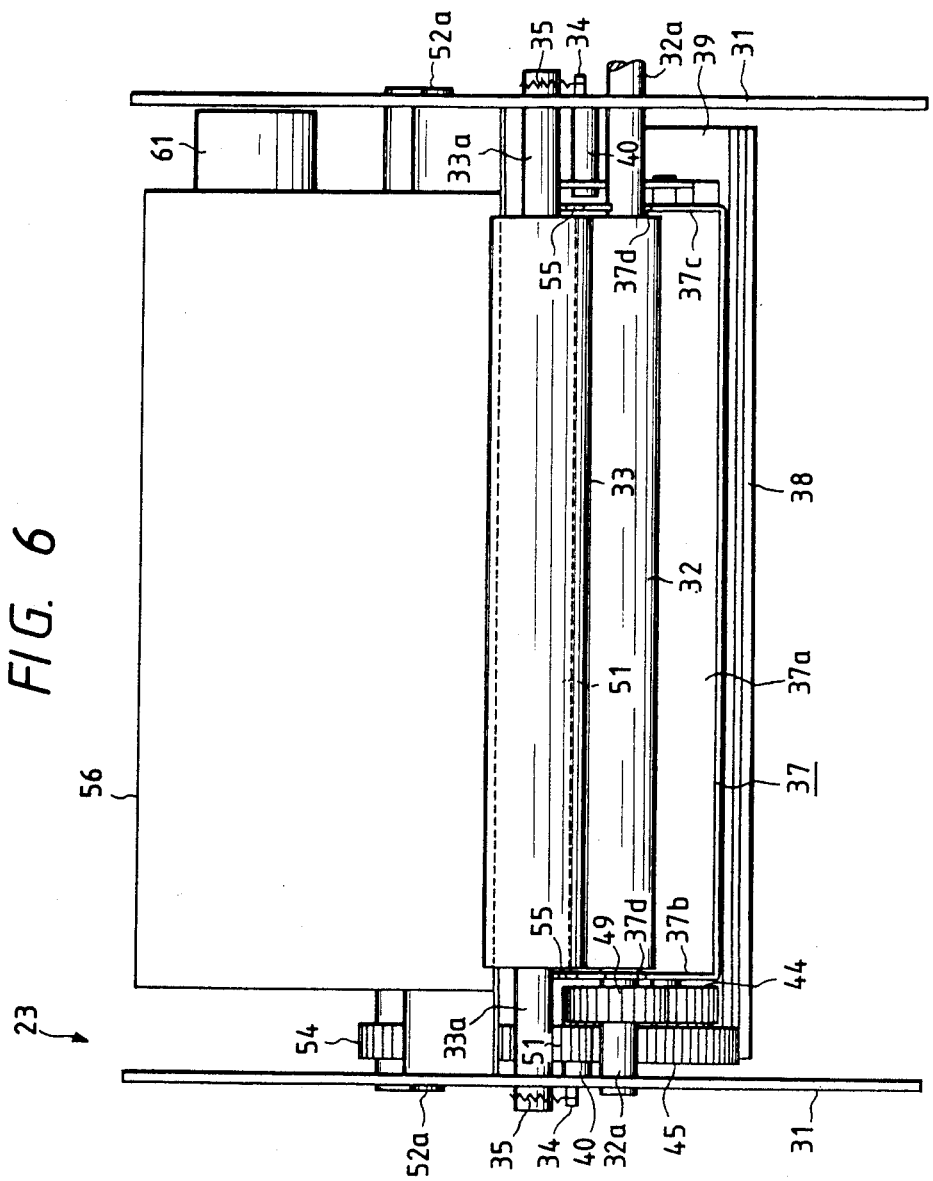
FIG. 6 is a top view of a front (right) part of the sheet heating device as shown in FIG. 3.
Figure 7:
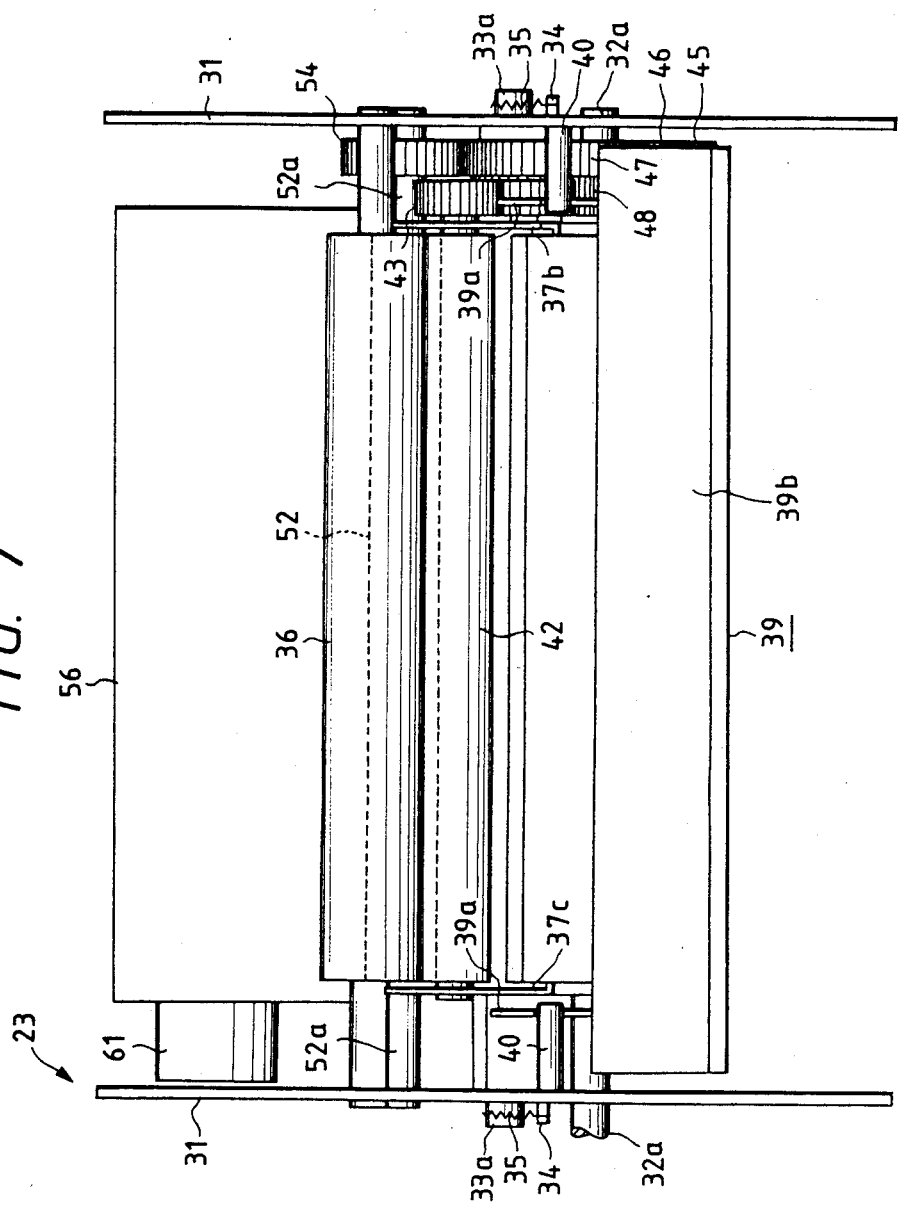
FIG. 7 is a top view of a rear (left) part of the sheet heating device as shown in FIG. 3.

As shown in FIGS. 3 to 7, a lower feed roller 32 is located on the feed side at the upstream (right side in FIG. 3) of the sheet feed path 50 and is rotatably supported between a pair of support plates 31 (see FIG. 6) arranged to face each other at an interval. An associated upper sheet feed roller 33 located above the sheet feed path is rotatably supported between the spaced support plates 31 above the lower feed roller 32. A shaft 33a protruding from the opposite ends of the upper sheet feed roller 33 is adapted to pass through elongated holes 31a formed in the support plates 31. As shown in FIGS. 6 and 7, a pair of retainer projections 34 are formed on outer surfaces of the respective support plates 31, and springs 35 whose respective one ends are supported by the projections 34 are laid around the shaft ends 33a. Accordingly, the upper sheet feed roller 33 may be switched over between an operative position (FIG. 4) where the upper sheet feed roller 33 normally comes into contact with the lower paper feed roller 32 by the gravitational force thereof and the spring biasing force of the spring 35 to thereby press the developer sheet 17 therebetween and an inoperative position (FIG. 5) where the upper feed roller 33 is separated away from the lower feed roller 32 along the elongated hole 31a. When the upper feed roller 33 is located in the operative position as shown in FIG. 4, the upper feed roller 33 is rotated clockwise in accordance with the rotation of the sheet feed roller 32 to thereby feed the developer sheet 17 in cooperation with the sheet feed roller 32.

An upper sheet discharge roller 36 is rotatably supported between the support plates 31 on the discharge side of the sheet feed plate 50.

A plate 34 having a bottom plate 37a and a pair of side plates 37b and 37c each extending upwardly from the side edge of the bottom plate 37a is provided between the support plates 31. Bearing holes 37d formed in the end portion, on the sheet feed side, of both the side plates 37b and 37c are engaged with the shaft ends 32a of the sheet feed roller 32, so that the plate 37 is rotatable about the shaft ends 32a between two positions, that is, a closed position for feeding the developer sheet as shown in FIG. 4, and an open position for stopping the feed of the developer sheet 17 as shown in FIG. 5. Also, at the discharge end portion of the bottom plate 37a of the plate 37, there is formed a suspension portion 38. A lock lever 39 having a pair of a claw portion 39a and an operating portion 39b is rotatably provided between bearings 38a (one of which is shown) formed at both ends of the suspension portion 38. The plate 37 is held at the closed position shown in FIG. 4, by the engagement between the claw portions 39a and retainer pins 40 projecting from inner surfaces of both the support plates 31.

Also, a spring 41 for normally biasing the lock lever 39 in the engagement direction (in the clockwise direction) is interposed between the lock lever 39 and the bottom 37a. The lock lever 39 is rotated against the biasing force of the spring 41 from the position indicated by the solid line to the position indicated by the two-dot and dash line in FIG. 3, whereby the retention of the plate 37 is disabled.

A lower sheet discharge roller 42 that has the same diameter as that of the lower sheet feed roller 32 is rotatably supported in bearing holes 37e formed in the discharge end portions of the opposite side plates 37b and 37c, which bearing holes 37e are open upwardly. When the plate 37 is in the closed position, the lower sheet discharge roller 42 is brought into contact with the upper sheet discharge roller 36 and is in the operative position (FIG. 3) for pressingly clamping the developer sheet 17. The lower sheet discharge roller 42 is formed, for example, by foaming silicone rubber to be provided with a sponge type surface and has a rubber hardness above 15. When the plate 37 is in the closed position, thee lower sheet discharge roller 42 is contacted with the upper sheet discharge roller 36 and the sheet is clamped between the upper and lower sheet discharge rollers 36 and 42 at a nip pressure of 100 to 200 g.

On the other hand, when the plate is in the open position, the lower discharge roller 42 is switched over to the inoperative position (FIG. 5) where the roller 42 is separated away from the upper discharge roller 36. As shown in FIGS. 4 and 7, the discharge roller 42 is provided with a gear 43 at one end portion of the shaft 42a, and is drivingly connected to a gear 49, provided at the outer end portion of the shaft end 32a, through gears 44 to 48 rotatably supported on the outside of the side plate 37b b of the guide plate 37. In accordance with the rotation of a motor (not shown), the sheet feed roller 32 and the sheet discharge roller 42 are rotated counterclockwise through the gear train 44 to 48.

Also, the lower sheet discharge roller 42 is located in the operative position where the roller 42 comes into contact with the upper sheet discharge roller 36, so that the upper sheet discharge roller 36 is rotated clockwise in accordance with the rotation of the lower sheet discharge roller 42. The sheet guide plate 50 having a sheet feeding surface 50a is provided between the sheet feed roller 32 and the sheet discharge roller 42. Thus, the developer sheet 17 is fed along and on the sheet feeding surface 50a of the guide plate 50 in accordance with the rotations of the respective rollers 32, 33, 36 and 42. It should be noted that, in this embodiment, the feeding means is composed of the above-described sheet feed rollers 32 and 33 and the sheet guide plate 50.

Also, the numbers of teeth of the gears 44 and 48 are set to be equal to each other and the numbers of teeth of the gear 45 to 47 are set to be equal to one other. In addition, the number of teeth cf the gear 43 is about 10% larger than the number of teeth of the gear 49. Furthermore, a diameter of the sheet discharge roller 42 is equal to a diameter of the sheet feed roller 32. Accordingly, a peripheral speed of the sheet discharge roller 42 is higher than peripheral speed of the sheet feed roller 32. As a result, a suitable tension is applied to the developer sheet 17 during the travel of the sheet by the respective rollers 32, 33, 42 and 36.

An arcuate engagement projection 55 is formed as an operating member on an upper surface of the feed side end portion of each side plate 37b, 37c of the plate 37 on the feeding side of the sheet guide path. When the plate 37 is located in the open position as shown in FIG. 5, the engagement projection 55 is engaged with the shaft 33a of the sheet feed roller 33 to thereby lift the shaft 33a along the elongated hole 31a. Thus, the upper sheet feed roller 33 is switched over to the inoperative position away from the sheet feed roller 32.

A cover 56 having an inlet 56a and an outlet 56b at both ends and covering the upper portion of the sheet guide plate 50 is disposed above the sheet guide plate 50. A heater 57 is arranged on the discharge side within the cover 56. The heater 57 is composed of an insulating substrate 58 made of insulating material and extending over an entire region of the developer sheet 17 in the transverse direction, and a coil heater 59 wound around the substrate 58, so that air around the heater 57 is heated when currents are applied to the coil heater 59.

A blower fan 60 is provided on the feed side within the cover 56 and is rotatable about an axis in parallel to the transverse direction of the developer sheet 17. The blower fan 60 is rotated in the counterclockwise direction in FIG. 4 by a motor 61 (FIGS. 6 and 7). In this embodiment, the heating means is composed of the heater 57 and the blower fan 60, whereby heated air convection is formed in the direction indicated by the arrow along the inner wall of the cover case 56 and the surface of the developer sheet 17 over the entire transverse region of the sheet guide plate 50 constituting the sheet guide path.

Insulating rollers 51 and 52 made of, for example, silicone rubber and disposed close to the sheet feed roller 33 and the sheet discharge roller 36, respectively, are rotatably supported between the support plates 31 above the guide plate 50. As shown in FIG. 4, a distance between the sheet guide plate 50 and each of the insulating rollers 51 and 52 is slightly larger than a thickness of the developer sheet 17 (by about 1to 2 mm in this embodiment), so that each of the insulating rollers 51 and 52 is used for preventing a temperature increase of the sheet feed rollers 32 and 33 and the sheet discharge rollers 36 and 42 due to the heat of the heating means as described later. Also, as shown in FIG. 3, the insulating rollers 51 and 52 are rotated clockwise by the engagement between the gears 53 and 54 provided at the outer end portions of the shafts 51a and 52a and the above-described gears 45 and 47. The peripheral speeds of the insulating rollers 51 and 52 are set to be equal to that of the sheet feed roller 32, that is, the feed speed of the developer sheet 17.

Under the condition that the heated air convection is formed, when the sheet feed roller 32 and the sheet discharge roller 42 are drivingly rotated, the rotation of the sheet feed rollers 32 and 33 causes the developer sheet 17 to move from the inlet 56a into the cover case 56. Thereafter, the rotation of the sheet discharge roller 42 and the sheet discharge roller 36 causes the developer sheet 17 to move out of the outlet 56b. During this movement of the developer sheet 17, the latter is heated by the heated air convection so that the image is heat-fixed on the developer sheet 17. Also, in cooperation with the sheet feed roller 32 and the sheet discharge roller 42, the insulating rollers 51 and 52 are rotated clockwise at the same peripheral speed as the feed speed of the developer sheet 17 along the feed direction thereof. Even if the insulating roller 51 would be brought into contact with the image forming surface of the developer sheet 17 by the rotation of the insulating rollers 51 and 52, there is no fear that a scratch flow or damage would be formed.

Also, in the sheet heating device 23 in the foregoing embodiment, the insulating roller 51 (or 52) is provided in the vicinity of the inlet 56a (or outlet 56b) of the cover case 56, and the distance between the roller 51 (or 52) and the sheet guide plate 50 is slightly larger than the thickness of the developer sheet 17. Accordingly, it is possible to reduce a leakage of the heated air convection from the inlet 56a (or 56b) and to prevent the temperature increase of the sheet feed rollers 32 and 33 (36 and 42). As a result, it is possible to prevent the formation of bubbles that would be formed by boiling of thermally fusible substances and the melting of the thermally fusible substances due to the rapid heating of the developer sheet 17 on the sheet feed side. It is thus possible to obtain a high quality image without image faults such as a flow or a breakdown.

Also, in the embodiment, since the insulating roller 51 (or 52) is made of insulating silicone, it is possible to prevent the developer sheet 17 from adhering to the roller 51 (or 52).

As described above, it is possible to prevent the heating of the sheet feed discharge rollers for clamping and feeding the sheet and to prevent the formation of the bubbles due to the boiling of the thermally fusible substances and the adhering of the thermally fusible substances to the sheet feed and discharge rollers due the melting of the thermally fusible substances, thus obtaining without image faults such as flows and breakdown.

In particular, it is preferable that the heat insulating roller 52 located on the discharge side is made of foamed material of silicone rubber and its hardness is at 15 degrees in terms of rubber hardness. If the insulating roller 52 on the discharge side is made of foamed material of silicone rubber, a surface of the developer sheet 17 would hardly be damaged due to the soft surface of the sponge-like roller 52. In particular in the case where an overhead projector film is used as the developer sheet 17 or a shiny mode is adapted, the advantage of the foamed roller 52 is remarkable. The construction and operation of the above sheet heating device is described in detail in the Co-pending U.S. patent application Ser. No. 07/425,940 filed on Oct. 24, 1989.

Also, a modification of the foregoing embodiment will now be described in order to prevent a generation of sheet jam. In the modification, a distance between the sheet feed roller 51 and the guide plate 50 is slightly, i.e., about 1 mm larger than the thickeners of the developer sheet 17, whereas a distance between the discharge roller 52 and the guide plate 50 is about 2 mm larger than the thickness of the developer sheet 17. Accordingly, the sheet jam may be prevented as well as the temperature increase of the feed rollers 32 and 33 and the discharge rollers 36 and 42, due to the provision of the heat insulating rollers 51 and 52.

According to this modification, since the leakage amount of the heated air through the inlet 56a is decreased, a temperature increase of the sheet feed rollers 32 and 33 and the sheet discharge rollers 36 and 43 are prevented. It is thus possible to prevent the formation of bubbles due to the boiling of the thermally fusible substances on the developer sheet 17 heated on the sheet feed side, to ensure the high quality of the image. Furthermore, since the distance between the discharge side roller 52 and the guide plate 50 is larger than that on the sheet feed side, it is possible to eliminate a fear that the sheet jam would occur. Further, the surface of at least ore of the upper and lower sheet discharge rollers may be formed of a foamed material as described above.

Figure 8:
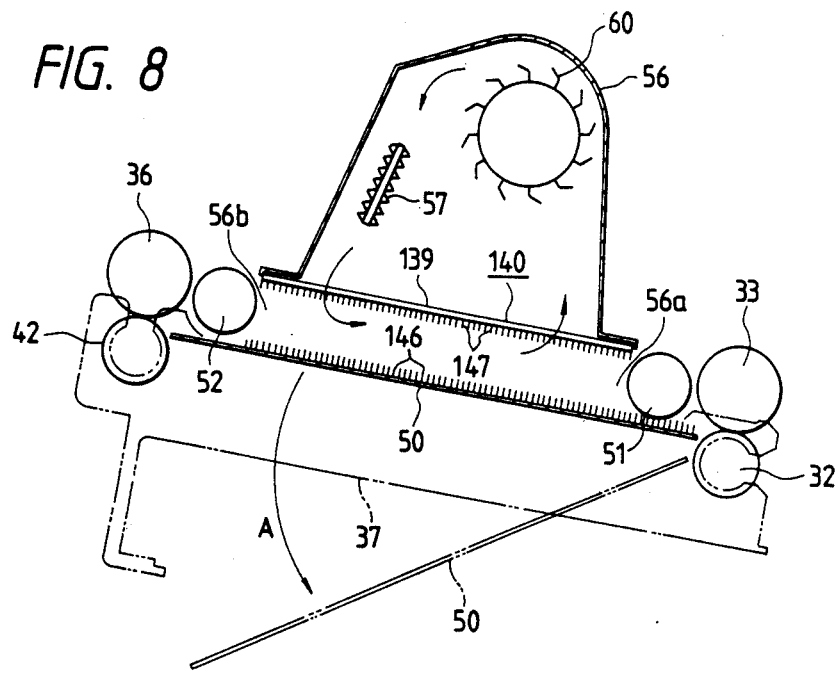
FIG. 8 shows another embodiment of the sheet heating device according to this invention n which plural capillary projections are provided.

FIG. 8 shows another embodiment of the sheet heating device according to this invention. The sheet heating device of this embodiment has the substantially same construction as that shown in FIGS. 3 to 5, except for some elements. The same elements as those of the sheet heating device as shown in FIGS. 3 to 5 are represented by the same reference numerals and the description for those same elements is eliminated. Further, to make the understanding of this embodiment clear, the constructions of the guide plate 37 and the other elements such as the lock lever 39 and so on are not shown in FIG. 8.

Figure 9:
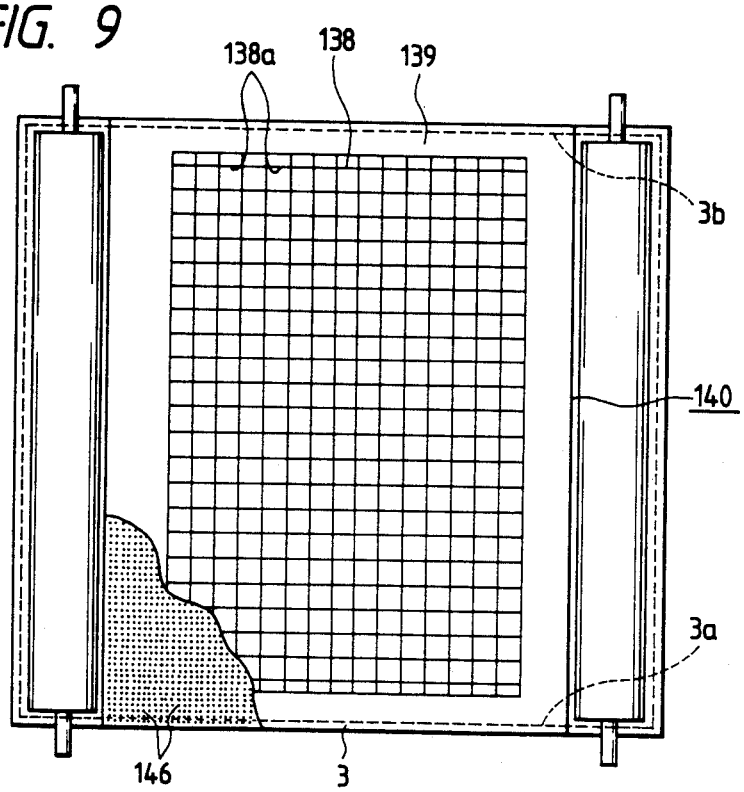
FIG. 9 shows a shielding plate used in the sheet heating device as shown in FIG. 8.

In this embodiment, at the lower opening portion of the cover case 56 is mounted a shielding plate 14 comprising a metal mesh member 138 having plural holes 138a for passing therethrough the heated air and the heat rays from the heater 57 and an outer frame portion 139 for supporting the metal mesh member 138 as shown in FIG. 9. The heated air or the heat rays are supplied through the holes 138a of the metal mesh member 138 to the developer sheet 17 which is fed along the sheet feed plate 50. Further, a number of capillary projections 146 and 147 like cirri are provided to the front surface (the contact surface with the developer sheet) of the sheet guide plate 50 and the outer frame portion 139 of the shielding plate 140, respectively, in such a manner as to be arranged spacedly from one another at a predetermined interval and project toward a sheet heating space 100 defined between the sheet guide plate 50 and the shielding plate 140. The capillary projections 146 and 147 comprises synthetic resin such as nylon 6.6 or the like, which has a lower thermal conductivity than at least the material of the sheet guide plate 50. The capillary projections may be provided only on the front surface of the sheet guide plate 50, and the capillary projections 147 is preferably formed of material having a lower conductivity than that of the material of the metal mesh.

Similarly in the sheet heating device as shown in Fig. 3, by supplying currents to the heater 57 and rotating the blower fan 60, the heated air is circulated through the shielding plate 140 and the sheet heating space 100, and the heat rays are passed through the metal mesh of the shielding plate 140 and applied to the sheet guide plate 50. In this state, the developer sheet 17 is supplied through the inlet 56a to the sheet guide space 100 by the upper and lower sheet feed rollers 33 and 32. Thereafter, the developer sheet 17 is heated to heat-fix the image thereon in the sheet heating space 100 and discharged through the outlet 56b to the discharge cassette 24 by the upper and lower sheet discharge rollers 36 and 42.

In this embodiment, since a number of the capillary projections are provided at least on the front surface of the sheet guide plate 50, the contact area between the rear surface of the developer sheet 17 and the sheet guide plate 50 is smaller in the sheet heating device having the capillary projections than in the sheet heating device having no capillary projections, so that the developer sheet is smoothly fed along the sheet guide path. Further, since the capillary projections comprise the material having a lower thermal conductivity than at least the iron sheet guide plate 50, the heat is not easily transferred from the sheet guide plate 50 to the developer sheet 17. Therefore, even though the developer sheet 17 is supplied to the sheet heating space 100 with the image surface of the developer sheet 17 erroneously placed face down, the thermally fusible substances forming the image are not immediately fused and does not easily adhere to the sheet guide plate 50. This prevents the sheet jam from occurring in the sheet heating device and the sheet guide plate 50 from being stained.

Further, in this embodiment, since the shielding plate 140 is further provided, the developer sheet 17 is prevented from invading the inside of the cover case 56 even though the developer sheet 17 is erroneously displaced from the sheet guide path to the heater 57. Moreover, when the capillary projections 147 are provided to the shielding plate 140, the direct contact of the developer sheet 17 with the shielding plate 140 is further prevented, so that the sheet jam and the staining of the shielding plate 140 due to the contact between the sheet developer and the shielding plate 140 are further prevented.

Still further, in this embodiment, the sheet guide plate 50 can be switched over from the operative position to the inoperative position as shown by an arrow A. Accordingly, if the sheet jam occurs in the sheet heating device, the jammed sheet is easily removed from the sheet heating device.

Still further, even though an operator has his hands inserted into the sheet heating space 100 for removing the jammed sheet and erroneously touches the capillary projections 146 and 147 in a condition that the temperature of the inside of the cover case 56 is not sufficiently decreased, he can safely handle the sheet heating device without suffering an accident such as a heat injury.

Figure 10:
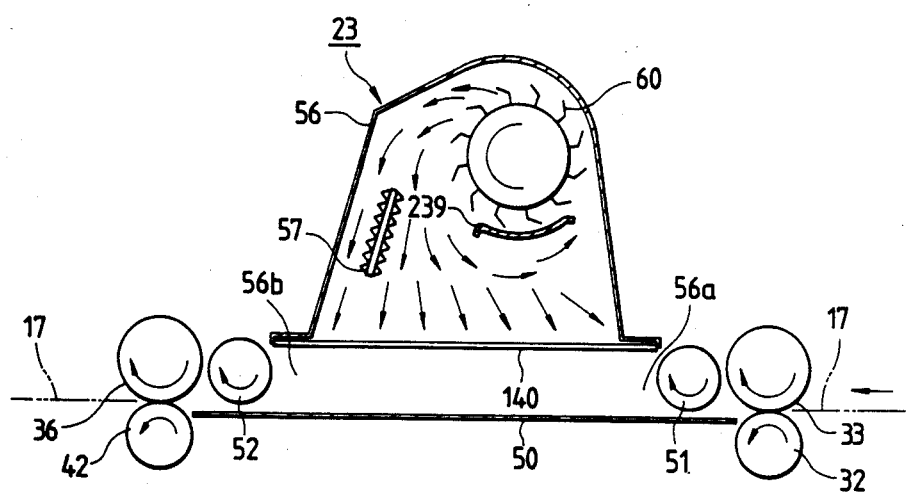
FIG. 10 shows another embodiment of the sheet heating device according to this invention in which a convection stabilizing member is provided.

FIG. 10 shows another embodiment of the sheet heating device according to this invention. The sheet heating device of this embodiment has the substantially same construction as that shown in FIG. 8, except for some elements. The same elements as those of the sheet heating device as shown in FIG. 8 are represented by the same reference numerals and the description for those same elements is eliminated. To make the understanding of this embodiment clear, the constructions of the guide plate 37 and the other elements such as the lock lever 39 and so on are not shown in FIG. 10.

Similarly in the sheet heating device as shown in FIG. 8, by supplying currents to the heater 57 and rotating the blower fan 60, the heated air is circulated through the shielding plate 140 and the sheet heating space 100, and the heat rays are passed through the metal mesh of the shielding plate 140 and applied to the sheet guide plate 50. In this state, the developer sheet 17 is supplied through the inlet 56a to the sheet guide space 100 by the upper and lower sheet feed rollers 33 and 32. Thereafter, the developer sheet 17 is heated to heat-fix the image thereon in the sheet heating space 100 and discharged through the outlet 56b to the discharge cassette 24 by the upper and lower sheet discharge rollers 36 and 42.

Figure 1:
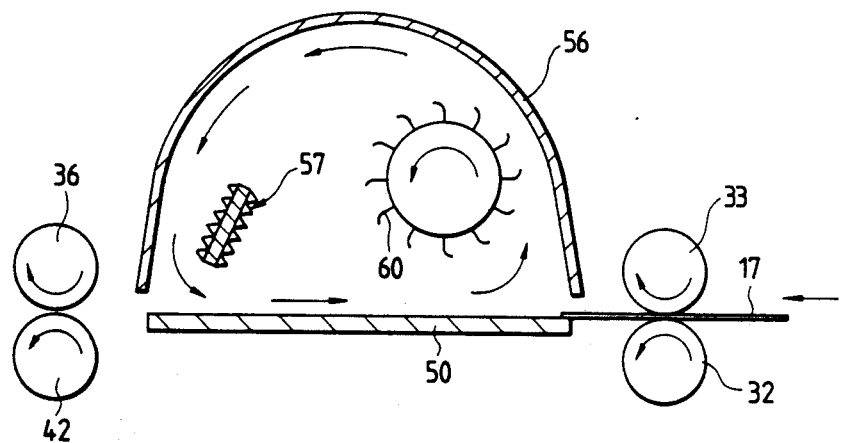
FIG. 1 shows a conventional sheet heating device used in a copying machine.

In this embodiment, an arcuate member 239 for homogeneously guide the heated air to the sheet guide space 100 is provided just beneath the blower fan 60 and is used to homogeneously guide the heated air over the sheet guide space 100 and the sheet guide path, so that the developer sheet 17 having the image thereon is homogeneously heated while passed through the sheet guide space 100, thereby homogeneously heat-fixing the image on the developer sheet 17. The arcuate member may be designed so that it extends along the blower fan 60 in a direction perpendicular to the sheet feeding direction. Accordingly, in this embodiment an effective heating period where the developer sheet 17 is heated in the sheet guide space 100 becomes long because the heated air is homogeneously guided over the sheet feeding path, and therefore a calorific value of the heater 57 is more reduced than the conventional sheet heating device as shown in FIG. 1. This reduction enables reduction of a power to be consumed.

Figure 11:
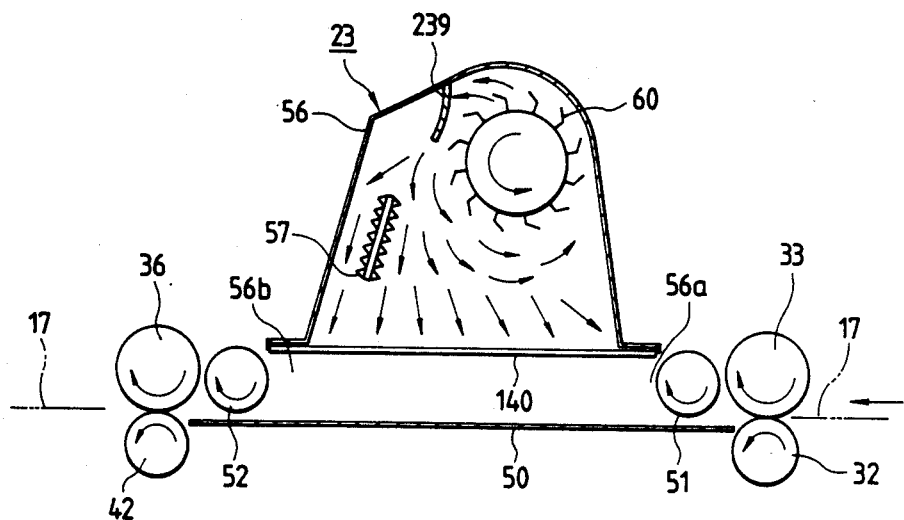
FIG. 11 shows a modification of the sheet heating device as shown in FIG. 10.

In the above embodiment, the arcuate member 239 is provided just beneath the blower fan 60, however, this invention is not limited thereto. For example, the arcuate member 239 may be provided at the upper inner wall of the cover case 56 between the blower fan 60 and the heater 57 such that the concave and convex surfaces of the arcuate member 239 face the heater 57 and the blower fan 60, respectively, as shown in FIG. 11.

As described above, according to this invention, the stain of the sheet guide plate and the sheet feed/discharge rollers with the thermally fusible substances forming the image on the developer sheet can be prevented, so that the sheet jam and other troubles in the sheet heating device are beforehand prevented.

Further, according to this invention, the developer sheet is homogeneously heat-fixed by the heated air while fed through the sheet heating device, so that an image of high equality is obtained and a power consumed by the heater is reduced.

In the embodiments as described above, the sheet feeding operation in the sheet heating device is performed by the sheet feed rollers (32 and 33) and the sheet discharge rollers (36 and 42). However, in place of the those rollers, an endless belt may be used to perform the sheet feeding operation in the sheet heating device.

Further, in the embodiments as described above, the description is made particularly in a case where the sheet heating device according to this invention is used in a color copying machine. However, the sheet heating device according to this invention may be used in a monochromatic copying machine.

What is claimed is:

1. A sheet heating device for heat-fixing an image on a sheet comprising:
   sheet guide means having a sheet inlet and a sheet outlet at both ends thereof for guiding the sheet therethrough;
   sheet feeding means provided at the sheet inlet for supplying the sheet through the sheet inlet to said sheet guide means;
   sheet discharge means for provided at the sheet outlet for discharging the sheet through the sheet outlet;
   sheet heating means for heating the sheet while the sheet is fed through said sheet guide means; and
   sheet supporting means comprising plural capillary projections provided on said sheet guide means for supporting thereon the sheet supplied through the sheet inlet to prevent the sheet from directly contacting said sheet guide means, said capillary projections having a lower thermal conductivity than that of said sheet guide means.

2. A sheet heating device as claimed in claim 1, wherein said capillary projections comprise nylon 6.6.

3. A sheet heating device as claimed in claim 1, further comprising a cover case having an inner portion for accommodating said sheet heating means and an open portion, said cover case being provided in such a manner that the open portion of said cover case faces the sheet guide means, and shielding means provided at the open portion for preventing the sheet from erroneously invading the inner portion of said cover case.

4. A sheet heating device as claimed in claim 3, wherein said shielding means comprises a metal mesh and an outer frame for supporting said metal mesh.

5. A sheet heating device as claimed in claim 4, wherein said shielding means further comprises plural capillary projections projecting from said outer frame portion toward the sheet in said sheet guide means.

6. A sheet heating device as claimed in claim 5, wherein said capillary projections comprise nylon 6.6.

7. A sheet heating device as claimed in claim 1, further comprises heat insulating means provided at at least one of a position between said sheet heating means and said sheet feeding means and a position between said sheet heating means and said sheet discharge means for preventing a temperature increase of at least one of said sheet feeding means and said sheet discharge means.

8. A sheet heating device as claimed in claim 7, wherein said heat insulating means comprises a heat insulating roller, and wherein said heat insulating roller has an outer surface formed of foaming material.

9. A sheet heating device as claimed in claim 7, wherein said heat insulating means comprises first and second heat insulating rollers, said first heat insulating roller being positioned between said sheet heating means and said sheet feeding means and said second heat insulating roller being positioned between said sheet heating means and said sheet discharge means, the sheet being traveled between said sheet guide means and said heat insulating rollers and a distance between said second heat insulating roller and the sheet being larger than a distance between said first heat insulating roller and the sheet.

10. A sheet heating device as claimed in claim 1, wherein said sheet discharge means comprises a pair of sheet discharging rollers, and wherein each of said discharging rollers has an outer surface formed of foaming material.

11. A sheet heating device for heat-fixing an image on a sheet comprising:
    sheet guide means having a sheet inlet and a sheet outlet at both ends thereof for guiding the sheet therethrough;
    sheet feeding means rolled at the sheet inlet for supplying the sheet through the sheet inlet to said sheet guide means;
    sheet discharge means for provided at the sheet outlet for discharging the sheet through the sheet outlet;
    sheet heating means for heating air and heating the sheet with the heated air while the sheet is fed through said sheet guide means;
    air convecting means for circulating the heated air by convection while the sheet is heated with the heated air;
    a cover case having an inner wall provided in such a manner as to cover said sheet guide means, and wherein said cover case accommodates said sheet heating means and said air convecting means; and
    convection stabilizing means provided in said cover case for homogeneously guiding the heated air over said sheet guide means to homogeneously heat-fix the image on the sheet.

12. A sheet heating device as claimed in claim 11, wherein said convection stabilizing means comprises an arcuate member provided just beneath said air convecting means.

13. A sheet heating device as claimed in claim 11, wherein said convection stabilizing means comprises an arcuate member provided at the upper inner wall between said sheet heating means and said air convecting means in such a manner that the concave and convex surfaces of said arcuate member face said sheet heating means and said air convecting means, respectively.

14. A sheet heating device as claimed in claim 11, further comprises heat insulating means provided at at least one of a position between said sheet heating means and said sheet feeding means and a position between said sheet heating means and said sheet discharge means for preventing a temperature increase of at least one of said sheet feeding means and said sheet discharge means.

15. A sheet heating device as claimed in claim 14, wherein said heat insulating means comprises a heat insulating roller, and wherein said heat insulating roller has an outer surface formed of foaming material.

16. A sheet heating device as claimed in claim 14, wherein said heat insulating means comprises first and second heat insulating rollers, said first heat insulating roller being positioned between said sheet heating means and said sheet feeding means and said second heat insulating roller being positioned between said sheet heating means and said sheet discharge means, the sheet being traveled between said sheet guide means and said heat insulating rollers and a distance between said second heat insulating roller and the sheet being larger than a distance between said first heat insulating roller and the sheet.

17. A sheet heating device as claimed in claim 11, wherein said sheet discharge means comprises a pair of sheet discharging rollers, and wherein each of said discharging rollers has an outer surface formed of foaming material.

* * * * *